(12) United States Patent
Hoefler et al.

(10) Patent No.: US 7,824,988 B2
(45) Date of Patent: Nov. 2, 2010

(54) METHOD OF FORMING AN INTEGRATED CIRCUIT

(75) Inventors: Alexander Hoefler, Austin, TX (US); James D. Burnett, Austin, TX (US); Lawrence N. Herr, Coupland, TX (US)

(73) Assignee: Freescale Semiconductor, Inc., Austin, TX (US)

(*) Notice: Subject to any disclaimer, the term of this patent is extended or adjusted under 35 U.S.C. 154(b) by 72 days.

(21) Appl. No.: 12/357,163

(22) Filed: Jan. 21, 2009

(65) Prior Publication Data

US 2010/0181629 A1 Jul. 22, 2010

(51) Int. Cl.
 *H01L 21/8236* (2006.01)
(52) U.S. Cl. ............... 438/276; 438/183; 257/E21.672
(58) Field of Classification Search ............ 438/278, 438/276, 275; 257/E21.672
See application file for complete search history.

(56) References Cited

U.S. PATENT DOCUMENTS

| | | | | |
|---|---|---|---|---|
| 6,146,949 A * | 11/2000 | Wu | ............... | 438/275 |
| 6,864,142 B1 * | 3/2005 | Conn | ............... | 438/293 |
| 7,227,232 B2 | 6/2007 | Liou et al. | | |
| 7,518,179 B2 * | 4/2009 | Swift et al. | ............... | 257/321 |
| 2004/0077138 A1 * | 4/2004 | Houston et al. | ............... | 438/200 |
| 2008/0067600 A1 * | 3/2008 | Hsu et al. | ............... | 257/360 |
| 2008/0067608 A1 * | 3/2008 | Hsu et al. | ............... | 257/379 |

FOREIGN PATENT DOCUMENTS

WO 2007079295 A2 11/2006

OTHER PUBLICATIONS

Mistry, K., et al., "A 45nm Logic Technology with High-k+Metal Gate Transistors, Strained Silicon, 9 Cu Interconnect Layers, 193 nm Dry Patterning, and 100% Pb-free Packaging", IEDM 2007, pp. 247-250 (Intel).

* cited by examiner

*Primary Examiner*—Jarrett J Stark
(74) *Attorney, Agent, or Firm*—Kim-Marie Vo; Susan C. Hill

(57) ABSTRACT

A method includes forming a source, a drain, and a disposable gate (38) of the first transistor; forming a source, a drain, and a disposable gate of the second transistor; removing the disposable gates of the first transistor and the second transistor; forming a photoresist layer over the first transistor and the second transistor; patterning the photoresist layer to expose a gate region of the first transistor and a gate region of the second transistor; and implanting the substrate under the gate region of the first transistor and under the gate region of the second transistor, wherein implanting the substrate under the gate region of the first transistor provides a permanent shorting region between the source and the drain of the first transistor, and wherein implanting the substrate under the gate region of the second transistor adjusts a threshold voltage of the second transistor.

19 Claims, 7 Drawing Sheets

METHOD OF FORMING AN INTEGRATED CIRCUIT

BACKGROUND

1. Field

This disclosure relates generally to integrated circuits, and more specifically, to an integrated circuit having a transistor with a shorting region.

2. Related Art

As customers demand increased functionality and smaller products, the density of semiconductor devices needs to increase. One such technology that can improve density is NAND ROM devices. The largest increase in density can be taken advantage of if the NAND ROM devices are formed without a contact in the array (i.e., contactless). Most prior art NAND ROM devices, however, do not improve density because contacts are formed in the array itself. While there are some NAND ROM devices that are contactless, the process used to manufacture such devices involves using a dedicated mask, which must be aligned precisely. This mask increases manufacturing cost and complexity, which undesirably decreases yield. Therefore, a need exists for a process to manufacture a high density device, such a contactless NAND ROM device.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
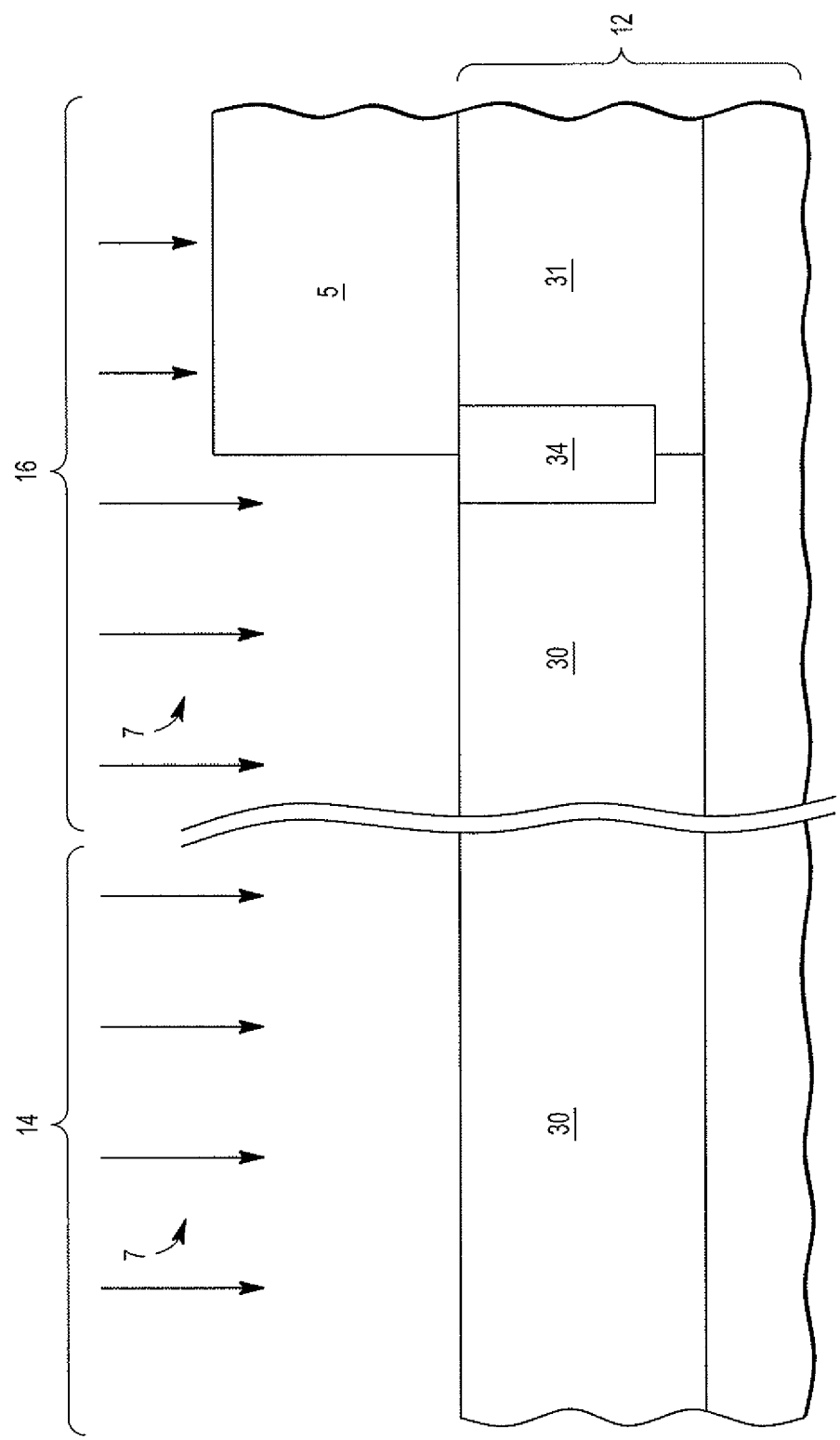
FIG. 1 illustrates a portion of a cross-section of a workpiece during a well implant in accordance with one embodiment.

FIG. 1 illustrates a portion of a cross-section of a workpiece 10 having a ROM region 14 and a logic region 16 during a well implant 7 in accordance with one embodiment. The ROM region 14 is where ROM device or transistors, such as NAND ROM devices, will be formed and the logic region 16 is where logic devices or transistors will be formed. The workpiece 10 will be an integrated circuit. The workpiece 10 includes a semiconductor substrate 12. The semiconductor substrate 12 can be any semiconductor material or combinations of materials, such as gallium arsenide, silicon germanium, silicon-on-insulator (SOI), silicon, monocrystalline silicon, the like, and combinations of the above. Subsequent to the well implant illustrated in FIG. 1, a shallow trench isolation region (STI) 34 and a well region 31 having a first conductivity type, such as an n-type conductivity type were formed. The well region 31 was formed during a well implant where the area that is exposed in FIG. 1 would have been covered by a mask, such as a photoresist layer. A mask 5, which may be a photoresist layer is formed over the well region 31 and a portion of the STI 34, to protect the well region 31 during the well implant 7. The well implant 7 implants a dopant type different than the dopant type used to form well region 31. Hence, the resulting well region 30 includes a second conductivity type, such as a p-type conductivity type.

Figure 2:
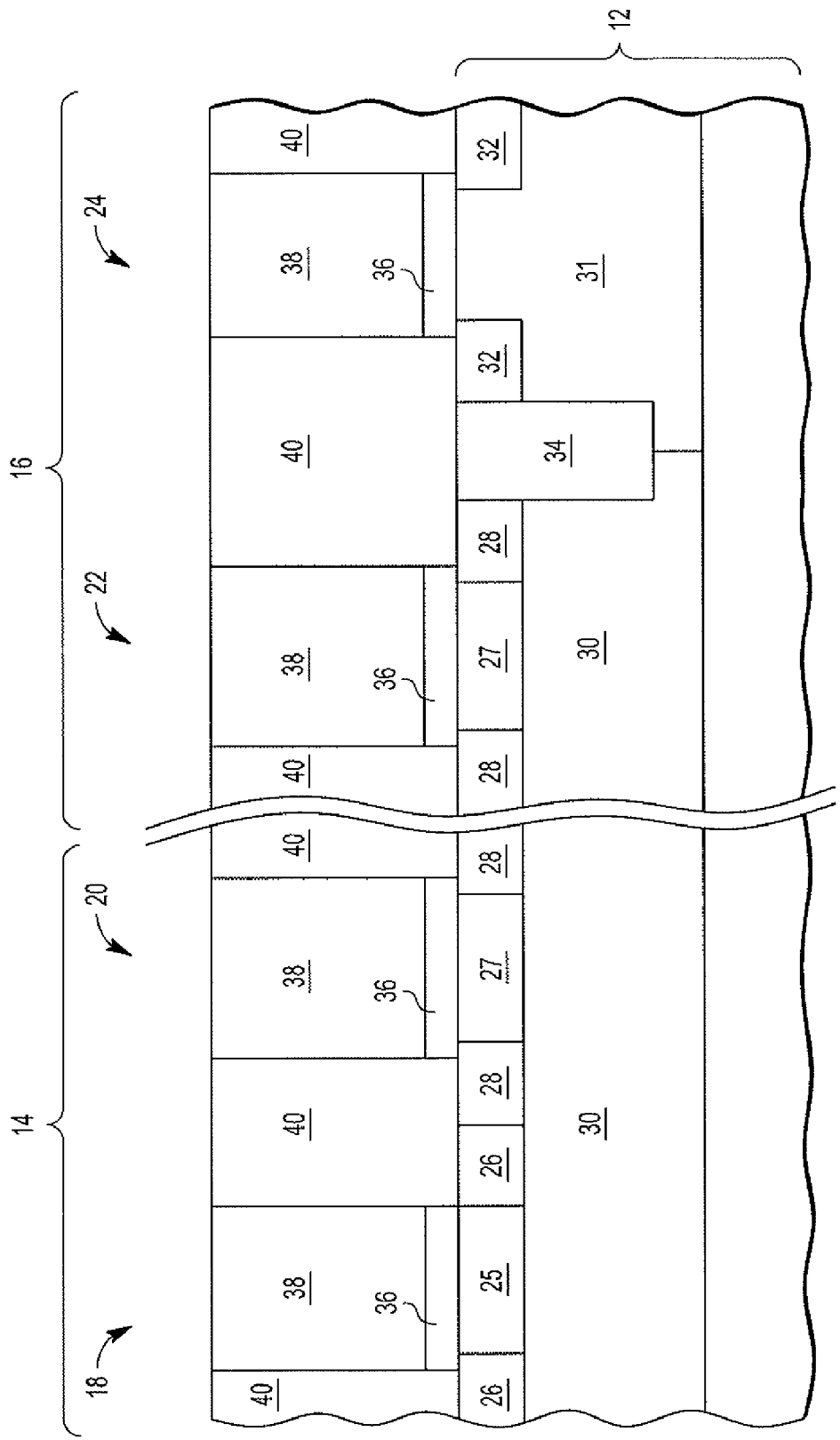
FIG. 2 illustrates the workpiece of FIG. 1 after further processing, such as forming disposable gates, in accordance with one embodiment.

FIG. 2 illustrates the workpiece of FIG. 1 after further processing in accordance with one embodiment. In the embodiment illustrated, two NMOS ROM devices or transistors 18 and 20 are being formed in the ROM region 14. In the embodiment illustrated, one NMOS logic device or transistor 22 and one PMOS logic device or transistor 24 is being formed in the logic region 16. Hence, in the illustrated embodiment, the channel regions 25 and 27 are n-channel regions.

A gate dielectric layer is formed over the semiconductor substrate 12 and patterned to form the gate dielectrics 36 for the devices 18, 20, 22 and 24. The gate dielectric layer may be grown, deposited (e.g., by CVD (chemical vapor deposition), PVD (physical vapor deposition), ALD (atomic layer deposition), the like) or combinations of the above. The gate dielectric 36 can be any suitable material, such as silicon dioxide, a high dielectric constant (hi-k) material, such as hafnium oxide, the like or combinations of the above. In addition, each gate dielectric 36 can be a different material. A dummy or disposable gate electrode material is formed over the gate dielectric layer and is patterned, either in a different process than what is used to pattern the gate dielectric layer or during the same process used to pattern the gate dielectric layer, to form the disposable gates 38. The disposable gate electrode material can be formed by any suitable process such as a deposition process, such as CVD, PVD, ALD, the like or combinations of the above. The disposable gate electrode material can be any suitable material, such as polysilicon, a nitride (e.g., silicon nitride), the like, or combinations of the above. Each disposable gate 38 may be the same material or different materials.

After forming the disposable gates 38, the source/drain regions 26, 28, and 32 are formed. For each device 18, 20, 22 and 24, source/drain regions 26, 28, and 32 are formed within the semiconductor substrate 12 and the well regions 30 and 31. In the embodiment illustrated, the source/drain regions 26 and 28 are both n-type and the source/drain region 32 is p-type. Hence, two different implant steps may be used. During one implant step an n-type dopant (e.g., arsenic) is implanted to form the source/drain regions 26 and 28 while protecting device 24 with a mask. During another implant step a p-type dopant (e.g., boron) is implanted to form the source/drain regions 32 while protecting the devices 18, 20, and 22 with a mask. Between each of the source/drain regions 26 and 28, channel regions 25 and 27, respectively, have been formed. The channel regions 25 and 27 are formed by doping the area between the source/drain regions 26 and 28 with a p-type dopant, in the embodiment illustrated, while protecting the device 24 with a mask. After forming the doped regions in the semiconductor substrate 12, an interlayer dielectric (ILD) or dielectric layer 40 is formed over the semiconductor substrate 12. The ILD may be deposited by any suitable process, such as CVD, PVD, ALD, the like, or combinations of the above.

Figure 3:
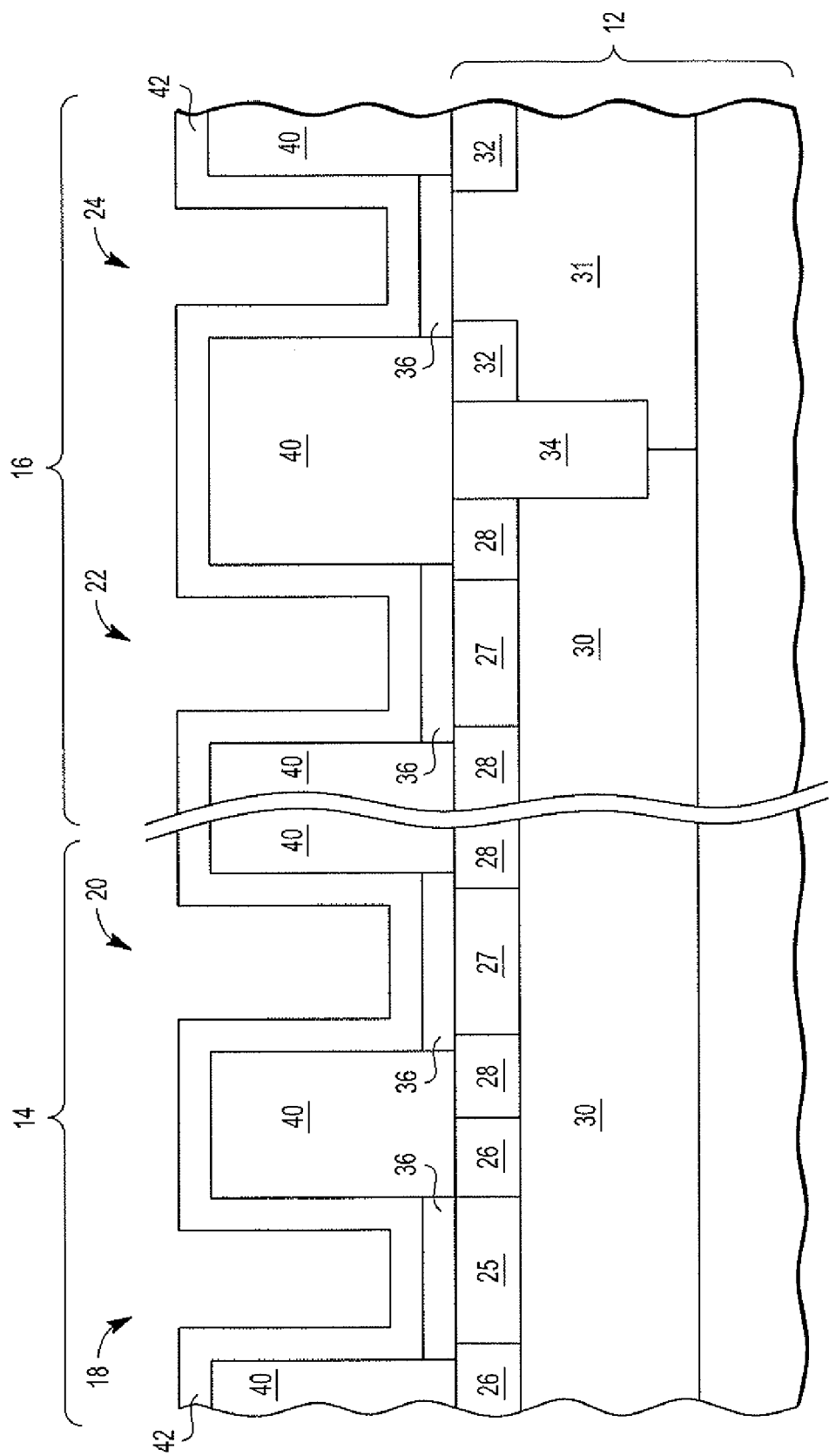
FIG. 3 illustrates the workpiece of FIG. 2 after removing the disposable gates and forming a first gate material in accordance with one embodiment.

FIG. 3 illustrates the workpiece of FIG. 2 after removing the disposable gates 38 and forming a first gate material in accordance with one embodiment. The disposable gates 38 may be removed, in one embodiment, using isotropic etching. If the disposable gates 38 are polysilicon, the chemistry may include fluorine. In the embodiment illustrated, a first gate electrode material 42 is formed over the workpiece 10. The first gate electrode material 42 may be a material chosen to control the work function of the NMOS devices 20 and 22 because this material will be in contact with the gate dielectric 36 and hence control the work function of the NMOS devices 20 and 22. For example, the first gate electrode material 42 may be tantalum carbide (TaC), tantalum nitride (TaN), nickel silicide (NiSi), tantalum silicide (TaSi), cobalt silicide (CoSi), tungsten (W), the like and combinations of the above. In one embodiment, the first gate electrode material 42 may not be present.

Figure 4:
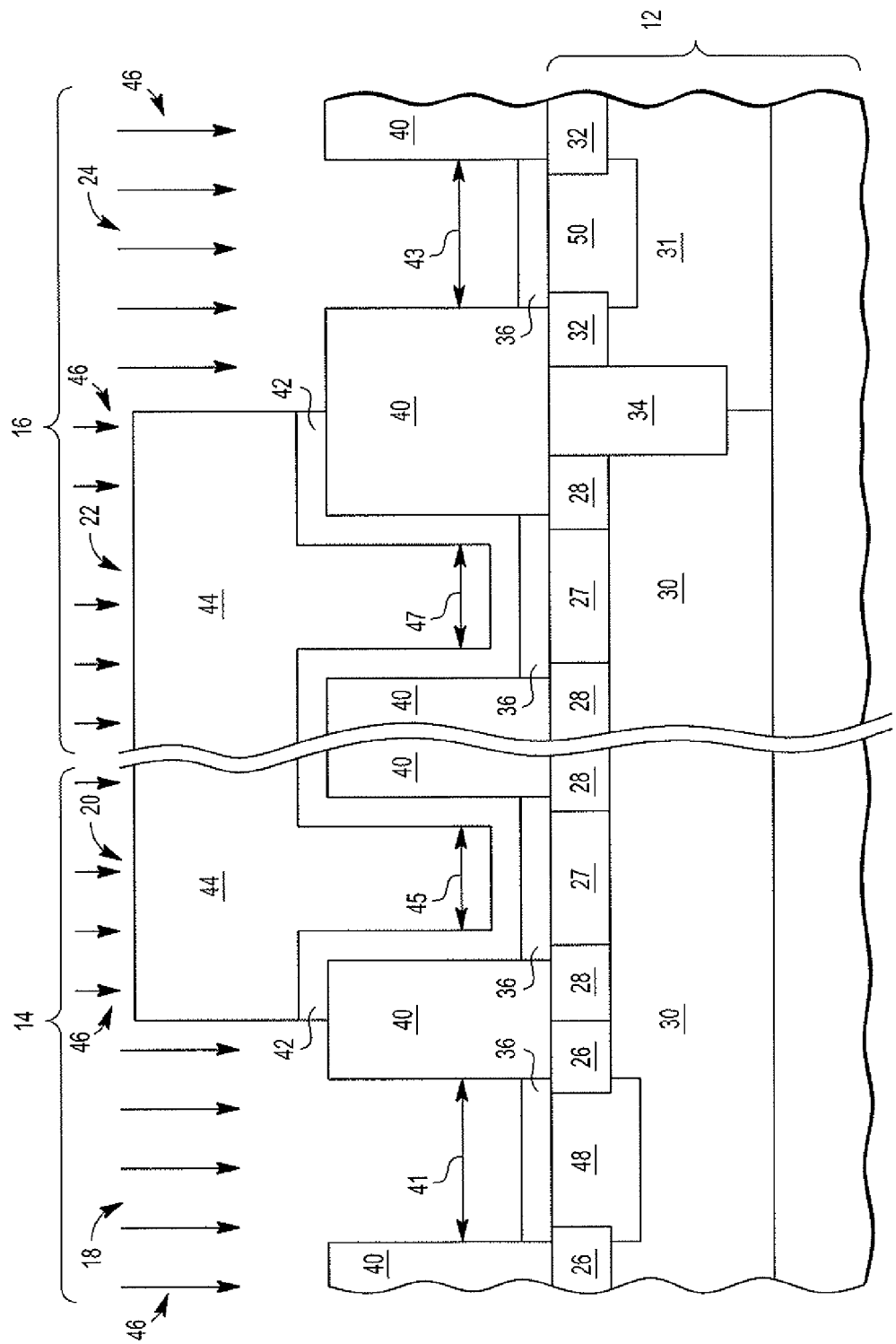
FIG. 4 illustrates the workpiece of FIG. 3 while forming a threshold voltage implant in accordance with one embodiment.

FIG. 4 illustrates the workpiece of FIG. 3 while forming a threshold voltage implant in accordance with one embodiment. In one embodiment, a photoresist layer 44 is formed over the semiconductor substrate 12. The photoresist layer 44 and the first gate electrode material 42 are patterned, in one embodiment during the same patterning processes, to expose gate regions 41 and 43. However, gate regions 45 and 47 are not exposed and are instead, protected by the photoresist layer 44. The gate region 41 is the gate region of the transistor 18 that will be programmed for operation. The gate region 43 is the gate region of the PMOS transistor 24. The gate regions 41 and 43 are the regions where the disposable gate is removed for the transistors 18 and 24, respectively. The gate region 45 is the gate region of the transistor 20 and the gate region 47 is the gate region of the transistor 22.

After exposing the gate regions 41 and 43, an implant, such as a threshold voltage implant 46 is performed. The implant 46 is self-aligned to the gate regions 41 and 43. In one embodiment, the implant 46 includes two implant steps that use dopants with the same conductivity but have different dopant concentrations and energies. The dopants may be the same or different elements for both implant steps. In the embodiment illustrated, the dopant conductivity is n-type. In one embodiment, the first implant step is a shallow implant of phosphorus. The shallow implant sets the concentration at the surface of the semiconductor substrate 12. For this step, in one embodiment the peak concentration of phosphorus in the substrate is approximately 6E17 ions/cubic cm to approximately 1.5E18 ions/cubic cm. In one embodiment, the dosage is approximately 6E13 to approximately 10E13 ions/sq cm. In one embodiment, the energy is approximately 10 keV to approximately 30 keV, or approximately 20 keV to approximately 30 keV, or approximately 25 keV. In one embodiment, the second implant step implants arsenic. The second implant step sets a concentration of the dopant to be deeper within the semiconductor substrate 12 than the first implant step so that the dopant does not interfere with the performance of the transistor 24 but shorts the source/drain regions 26 of the transistor 18. In one embodiment, the peak concentration of arsenic in the substrate is approximately 7E18 ions/cubic cm to approximately 12E18 ions/cubic cm. In one embodiment, the dose is approximately 4E14 ions/square cm to approximately 8E14 ions/square cm or approximately 6E14 ions/square cm. In one embodiment, the energy is approximately 150 keV to approximately 250 keV or approximately 200 keV. Other dopants can be used (e.g., phosphorus or antimony can be used in the second implant step) and a skilled artisan recognizes that the concentration, energy and dose may change.

The implant 46 forms a shorting region 48, which shorts the source/drain regions 26, and a PMOS adjusted channel region 50. (One of the regions 26 is a drain and the other is a source.) In one embodiment, the shorting region 48 is a non-depletion region, which may never be fully depleted of current-conducting carriers, as a result of the doping concentration used and the vertical depth from the channel surface. The parameters chosen for the implant 46 allow for the implant to provide the desired threshold voltage adjustment for the PMOS transistor 24 and to permanently short the source and drain regions 26 of the NMOS transistor 18 so that the region 48 is never fully depleted during operation.

Figure 5:
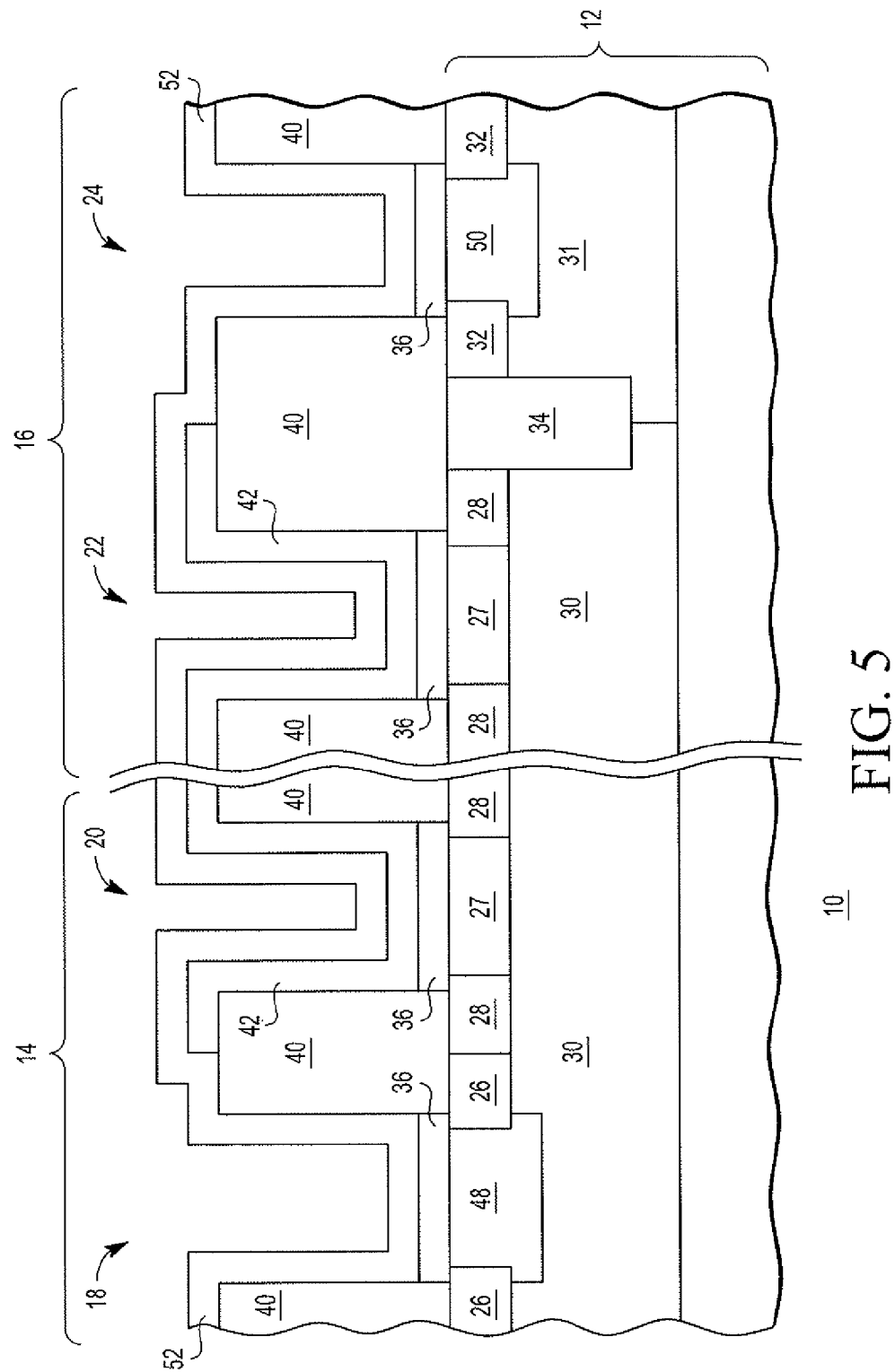
FIG. 5 illustrates the workpiece of FIG. 4 after forming a second gate material in accordance with one embodiment.

FIG. 5 illustrates the workpiece of FIG. 4 after forming a second gate electrode material 52 in accordance with one embodiment. In the embodiment illustrated, a second gate electrode material 52 is formed over the workpiece 10. The second gate electrode material 52 may be a material chosen to control the work function of the PMOS device 24 because this material will be in contact with the gate dielectric 36 and hence control the work function of the PMOS device 24. For example, the second gate electrode material 52 may be titanium nitride, rhenium (Re), platinum (Pt), ruthenium oxide ($RuO_2$), rhodium silicide (RhSi), palladium silicide (PdSi), tungsten carbon nitride ($WC_xN_y$), the like and combinations of the above. In one embodiment, the second gate electrode material 52 may not be present.

Figure 6:
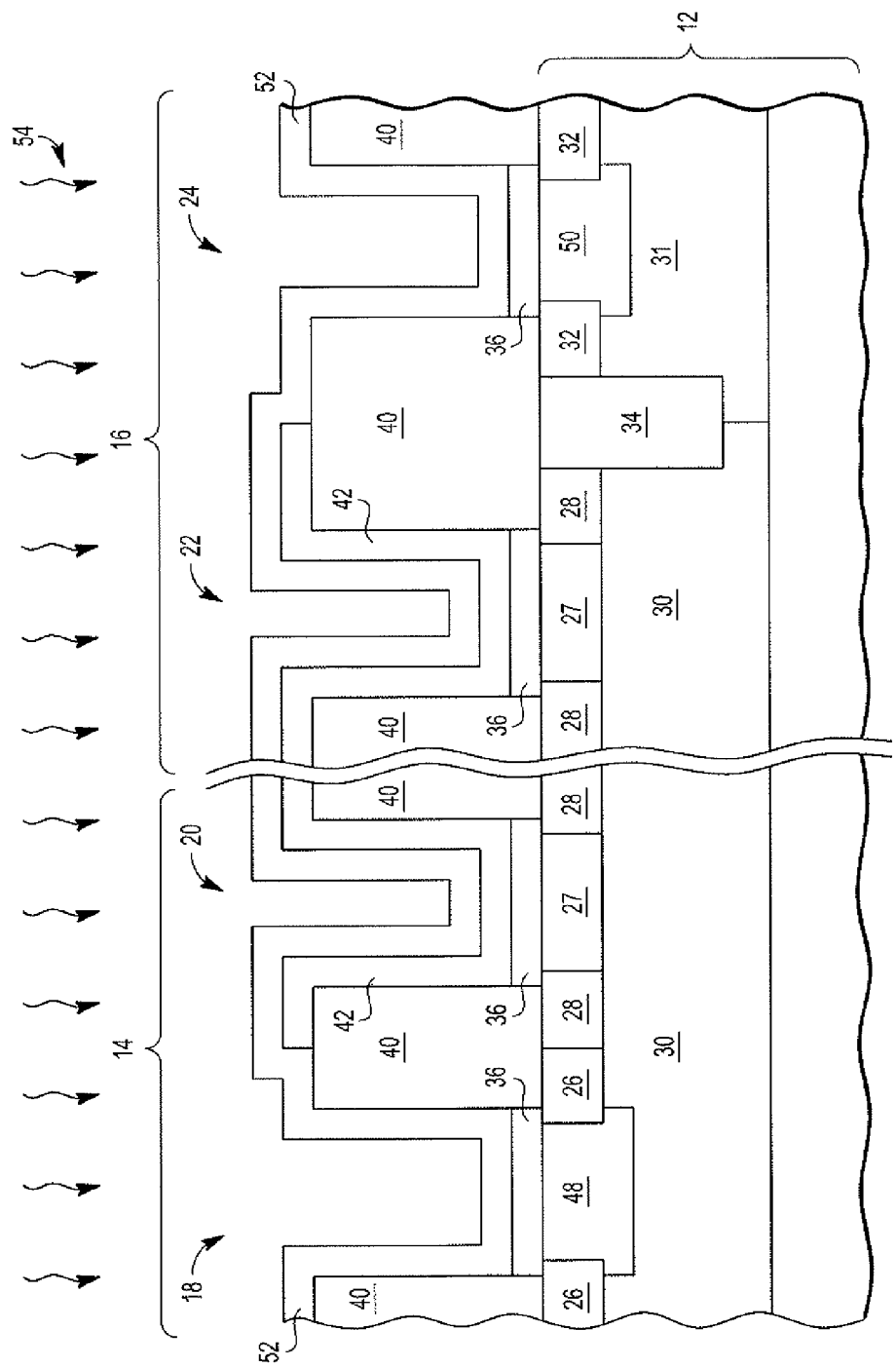
FIG. 6 illustrates the workpiece of FIG. 5 during an anneal in accordance with one embodiment.

FIG. 6 illustrates the workpiece of FIG. 5 during an anneal 54 in accordance with one embodiment. In one embodiment, the anneal 54 occurs in argon at a temperature between approximately 900 degrees Celsius to approximately 1100 degrees Celsius. The anneal 54 may be used to activate the dopants in the shorting region 48 and the PMOS adjusted channel region 50. In one embodiment, the anneal 54 occurs after forming the second gate electrode material 52. In another embodiment, the anneal 54 occurs after the implant 46 but before forming the second gate electrode material 52. In another embodiment, the anneal 54 occurs anytime after performing the implant 46 and before backend processing (e.g., forming contacts and interconnect lines) occurs.

Figure 7:
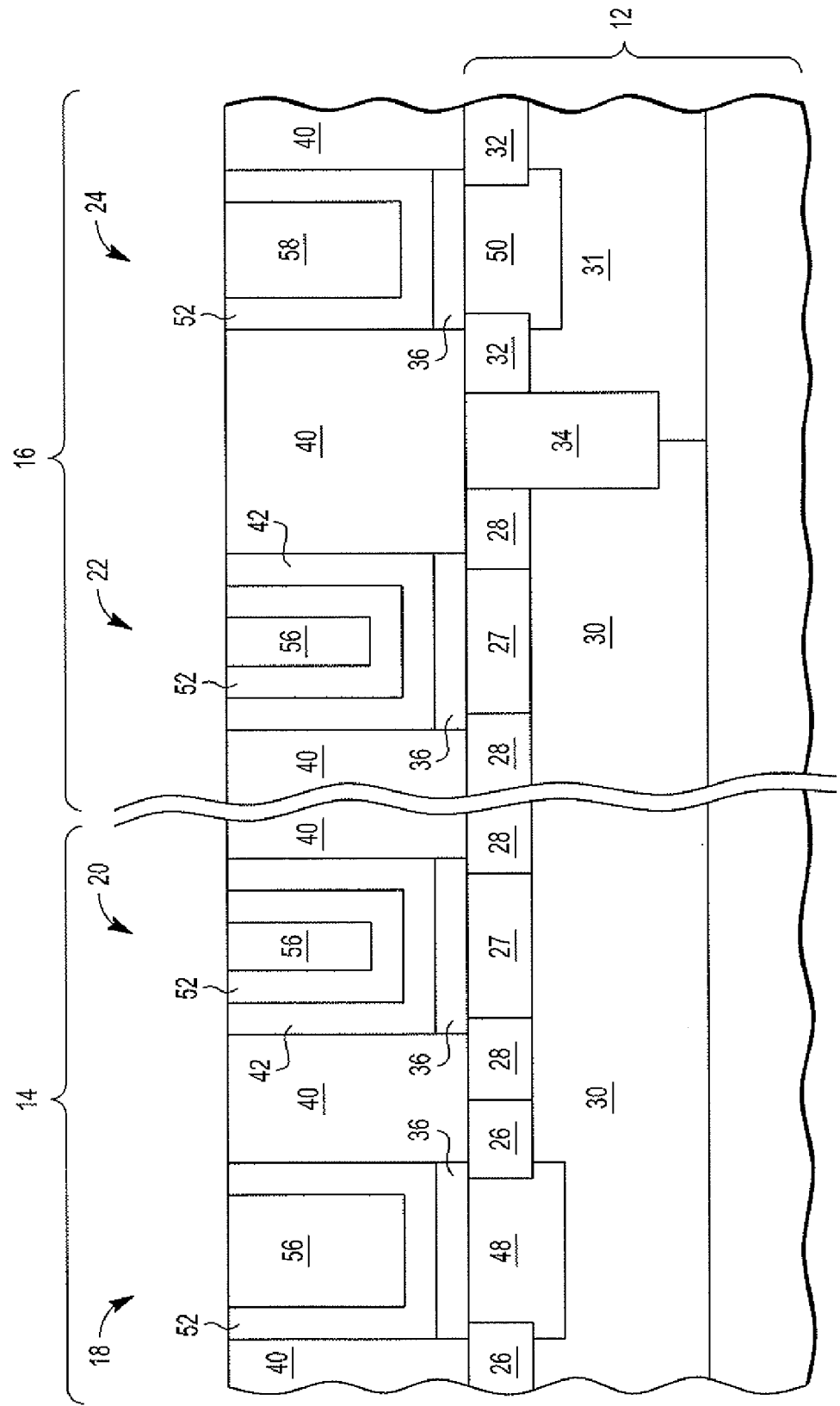
FIG. 7 illustrates the workpiece of FIG. 6 after forming a third gate material and planarizing the workpiece in accordance with one embodiment.

FIG. 7 illustrates the workpiece of FIG. 6 after forming a third gate material 56 and 58 and planarizing the workpiece in accordance with one embodiment. In one embodiment, a third gate material is formed over the workpiece 10. The third gate material may be any suitable gate material such as polysilicon, a metal gate (e.g., tungsten, aluminum), the like, or combinations of the above. The third gate material can be formed by any suitable process such as a deposition process (e.g., CVD, PVD, ALD, the like, or combinations of the above). The third gate material may be the same for all transistors 18, 20, 22, or 24 or a different gate material may be used for the PMOS transistor 24 and the NMOS transistors 18, 20, and 22. (In such case, a mask and two deposition processes may be needed). After forming the third gate material, planarization (e.g., chemical mechanical polishing or etching) may be performed to remove portions of the first gate electrode material 42, the second gate electrode material 52 and the third gate material 56 and 58 that are above the surface of the dielectric layer 40. After planarizing the structure of FIG. 7 is formed so that the gate electrode, which can also be referred to as gate conductor, of the NAND ROM NMOS transistor 18, which will be programmed, includes the second gate electrode material 52 and the third gate electrode material 56; the NAND ROM NMOS transistor 20 includes the first gate electrode material 42, the second gate electrode material 52 and the third gate electrode material 56; the NMOS logic transistor 22 includes the first gate electrode material 42, the second gate electrode material 52 and the third gate electrode material 56; and the PMOS logic transistor 24 includes the second gate electrode material 52 and the third gate electrode material 58. The first gate electrode material is in contact with the gate dielectric 36 for the NMOS devices 20 and 22 but not the NMOS device 18. Instead, the second gate electrode material 52 is in contact with the gate dielectric 36 for the NAND ROM NMOS transistor 18 as is the case with the PMOS logic transistor 24. The second gate electrode material 52 can be in contact with the gate dielectric 36 for the NAND ROM NMOS transistor 18 because this transistor is shorted.

Various embodiments include the following. Embodiment 1 includes a method for forming a first transistor having a first conductivity type and for forming a second transistor having a second conductivity type in a substrate, the method comprising forming a source, a drain, and a disposable gate of the first transistor; forming a source, a drain, and a disposable gate of the second transistor; removing the disposable gate of the first transistor and the disposable gate of the second transistor; forming a photoresist layer over the first transistor and the second transistor; patterning the photoresist layer to expose a gate region of the first transistor and to expose a gate region of the second transistor; and implanting the substrate under the gate region of the first transistor and under the gate region of the second transistor, wherein implanting the substrate under the gate region of the first transistor provides a permanent shorting region between the source and the drain of the first transistor, and wherein implanting the substrate under the gate region of the second transistor adjusts a threshold voltage of the second transistor. Embodiment 2 includes a method as in embodiment 1, further comprising forming a dielectric layer over at least a portion of the source and drain of the first transistor and over at least a portion of the source and drain of the second transistor. Embodiment 3 includes a method as in embodiments, further comprising: annealing after said step of implanting. Embodiment 4 includes a method as in embodiment 3, further comprising: removing the photoresist layer before said step of annealing. Embodiment 5 includes a method as in embodiment 1, further comprising: forming gate electrode material in one or more of the gate region of the first transistor and in the gate region of the second transistor. Embodiment 6 includes a method as in embodiment 5, wherein the step of forming the gate electrode material comprises: forming a first gate electrode material in the gate region of the first transistor and in the gate region of the second transistor, the first gate electrode material comprising a first metal and having a first work function; forming a second gate electrode material in the gate region of the first transistor, comprising a second metal and having a second work function, wherein the first metal and the second metal are different; and forming a third gate electrode material in the gate region of the second transistor, comprising a third metal and having a third work function, wherein the first metal and the third metal are different. Embodiment 7 includes a method as in embodiment 5, wherein the gate electrode material comprises polysilicon. Embodiment 8 includes a method as in embodiment 5, further comprising: planarizing the gate electrode material. Embodiment 9 includes a method as in embodiment 1, wherein the step of implanting the substrate under the gate region of the first transistor and under the gate region of the second transistor comprises: implanting the substrate under the gate region of the first transistor and under the gate region of the second transistor with a first dopant having the first conductivity type and a first implant dose; and implanting the substrate under the gate region of the first transistor and under the gate region of the second transistor with a second dopant having the first conductivity type and a second implant dose. Embodiment 10 includes a method as in embodiment 9, wherein the first dopant comprises phosphorus and the second dopant comprises arsenic. Embodiment 11 includes a method as in embodiments, further comprising: forming a NAND ROM comprising the first transistor. Embodiment 12 includes a method as in embodiment 1, further comprising: forming a source, a drain, and a disposable gate of a third transistor having the first conductivity type, wherein the photoresist overlies a gate region of the third transistor during said step of implanting.

Embodiment 13 includes a method for forming, in a substrate, a first transistor having a first conductivity type, a second transistor having a second conductivity type, and a third transistor having the first conductivity type, the method comprising: forming a source, a drain, and a disposable gate of the first transistor; forming a source, a drain, and a disposable gate of the second transistor; forming a source, a drain, and a disposable gate of the third transistor; removing the disposable gate of the first transistor, the disposable gate of the second transistor, and the disposable gate of the third transistor; forming a photoresist layer over the first transistor, the second transistor, and the third transistor; patterning the photoresist layer to expose a gate region of the first transistor, to expose a gate region of the second transistor, and to not expose a gate region of the third transistor; implanting the substrate under the gate region of the first transistor and under the gate region of the second transistor without implanting the substrate under the gate region of the third transistor, wherein implanting the substrate under the gate region of the first transistor provides a permanent shorting region between the source and the drain of the first transistor, and wherein implanting the substrate under the gate region of the second transistor adjusts a threshold voltage of the second transistor; removing the photoresist layer after said step of implanting; and annealing after said step of removing the photoresist layer. Embodiment 14 includes a method as in embodiment 13, further comprising: forming a dielectric layer over at least a portion of the source and drain of the first transistor, over at least a portion of the source and drain of the second transistor, and over at least a portion of the source and drain of the third transistor. Embodiment 15 includes a method as in embodiment 13, further comprising: forming gate electrode material in one or more of the gate region of the first transistor, the gate region of the second transistor, and the gate region of the third transistor. Embodiment 16 includes a method as in embodiment 15, wherein the step of forming the gate electrode material comprises: forming a first gate electrode material in the gate region of the first transistor, in the gate region of the second transistor, and in the gate region of the third transistor, the first gate electrode material comprising a first metal and having a first work function; forming a second gate electrode material in the gate region of the first transistor, and in the gate region of the third transistor, and not in the gate region of the second transistor, the second gate electrode material comprising a second metal and having a second work function; and forming a third gate electrode material in the gate region of the second transistor, and not in the gate region of the first transistor, and not in the gate region of the third transistor, the third gate electrode material comprising a third metal and having a third work function, wherein the second metal and the third metal are different; and forming a fourth gate electrode material in the gate region of the third transistor and not in the gate region of the first transistor, and not in the gate region of the second transistor, the fourth gate electrode material comprising a fourth metal and having a fourth work function, wherein the first metal and the fourth metal are different. Embodiment 17 includes a method as in embodiment 15, further comprising: planarizing the gate electrode material. Embodiment 18 includes a method as in embodiment 13, wherein the step of implanting the substrate comprises: implanting the substrate under the gate region of the first transistor and under the gate region of the second transistor with a first dopant having the first conductivity type and a first implant dose; and implanting the substrate under the gate region of the first transistor and under the gate region of the second transistor with a second dopant having the first conductivity type and a second implant dose. Embodiment 19 includes a method as in embodiment 13, further comprising: forming a NAND ROM comprising the first transistor.

Embodiment 20 includes a workpiece, comprising: a transistor formed in a semiconductor substrate, the transistor comprising a source, a drain, a gate dielectric, and a gate conductor; and a permanent shorting region formed in the semiconductor substrate and underlying the gate dielectric, the permanent shorting region permanently electrically shorting the source and the drain of the transistor, wherein the permanent shorting region is self-aligned with the gate dielectric and the gate conductor, wherein during operation of the transistor, the permanent shorting region comprises a channel region extending into the permanent shorting region from an interface between the permanent shorting region and the gate dielectric, wherein during operation of the transistor, a portion of the channel region is depleted, and wherein a maximum dopant concentration in the permanent shorting region is located outside the portion of the channel region that is depleted.

By now it should be appreciated that there has been provided a method for forming dense transistors without contacts, especially for NAND ROM devices. The process is compatible with processes used for forming logic devices. The process allows for desirable a cell size reduction. For example, the cell size can be reduced by the contact widths that would have been present if intermediate source/drain contacts were used plus two times the spacing between the gate electrode and the intermediate source/drain contacts minus the spacing between two adjacent ROM gate electrodes. In one embodiment, a self-aligned implant, which may include more than one step, is used to form a shorting region that shorts the source and drain regions together. This avoids the use of a mask that requires tight alignment tolerance, which is difficult to achieve repeatedly in manufacturing.

Although the invention has been described with respect to specific conductivity types or polarity of potentials, skilled artisans appreciated that conductivity types and polarities of potentials may be reversed. Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a first transistor having a first conductivity type and for forming a second transistor having a second conductivity type in a substrate, the method comprising:
   forming a source, a drain, and a disposable gate of the first transistor;
   forming a source, a drain, and a disposable gate of the second transistor;
   removing the disposable gate of the first transistor and the disposable gate of the second transistor;
   forming a photoresist layer over the first transistor and the second transistor;
   patterning the photoresist layer to expose a gate region of the first transistor and to expose a gate region of the second transistor; and
   implanting the substrate under the gate region of the first transistor and under the gate region of the second transistor,
   wherein implanting the substrate under the gate region of the first transistor provides a permanent shorting region between the source and the drain of the first transistor, and
   wherein implanting the substrate under the gate region of the second transistor adjusts a threshold voltage of the second transistor.

2. A method as in claim 1, further comprising:
   forming a dielectric layer over at least a portion of the source and drain of the first transistor and over at least a portion of the source and drain of the second transistor.

3. A method as in claim 1, further comprising:
   annealing after said step of implanting.

4. A method as in claim 3, further comprising:
   removing the photoresist layer before said step of annealing.

5. A method as in claim 1, further comprising:
   forming gate electrode material in one or more of the gate region of the first transistor and in the gate region of the second transistor.

6. A method as in claim 5, wherein the step of forming the gate electrode material comprises:
   forming a first gate electrode material in the gate region of the first transistor and in the gate region of the second transistor, the first gate electrode material comprising a first metal and having a first work function;
   forming a second gate electrode material in the gate region of the first transistor, comprising a second metal and having a second work function, wherein the first metal and the second metal are different; and forming a third gate electrode material in the gate region of the second transistor, comprising a third metal and having a third work function, wherein the first metal and the third metal are different.

7. A method as in claim 5, wherein the gate electrode material comprises polysilicon.

8. A method as in claim 5, further comprising:
planarizing the gate electrode material.

9. A method as in claim 1, wherein the step of implanting the substrate under the gate region of the first transistor and under the gate region of the second transistor comprises:
implanting the substrate under the gate region of the first transistor and under the gate region of the second transistor with a first dopant having the first conductivity type and a first implant dose; and
implanting the substrate under the gate region of the first transistor and under the gate region of the second transistor with a second dopant having the first conductivity type and a second implant dose.

10. A method as in claim 9, wherein the first dopant comprises phosphorus and the second dopant comprises arsenic.

11. A method as in claim 1, further comprising:
forming a NAND ROM comprising the first transistor.

12. A method as in claim 1, further comprising:
forming a source, a drain, and a disposable gate of a third transistor having the first conductivity type,
wherein the photoresist overlies a gate region of the third transistor during said step of implanting.

13. A method for forming, in a substrate, a first transistor having a first conductivity type, a second transistor having a second conductivity type, and a third transistor having the first conductivity type, the method comprising:
forming a source, a drain, and a disposable gate of the first transistor;
forming a source, a drain, and a disposable gate of the second transistor;
forming a source, a drain, and a disposable gate of the third transistor;
removing the disposable gate of the first transistor, the disposable gate of the second transistor, and the disposable gate of the third transistor;
forming a photoresist layer over the first transistor, the second transistor, and the third transistor;
patterning the photoresist layer to expose a gate region of the first transistor, to expose a gate region of the second transistor, and to not expose a gate region of the third transistor;
implanting the substrate under the gate region of the first transistor and under the gate region of the second transistor without implanting the substrate under the gate region of the third transistor,
wherein implanting the substrate under the gate region of the first transistor provides a permanent shorting region between the source and the drain of the first transistor, and wherein implanting the substrate under the gate region of the second transistor adjusts a threshold voltage of the second transistor;
removing the photoresist layer after said step of implanting; and
annealing after said step of removing the photoresist layer.

14. A method as in claim 13, further comprising:
forming a dielectric layer over at least a portion of the source and drain of the first transistor, over at least a portion of the source and drain of the second transistor, and over at least a portion of the source and drain of the third transistor.

15. A method as in claim 13, further comprising:
forming gate electrode material in one or more of the gate region of the first transistor, the gate region of the second transistor, and the gate region of the third transistor.

16. A method as in claim 15, wherein the step of forming the gate electrode material comprises:
forming a first gate electrode material in the gate region of the first transistor, in the gate region of the second transistor, and in the gate region of the third transistor, the first gate electrode material comprising a first metal and having a first work function;
forming a second gate electrode material in the gate region of the first transistor, and in the gate region of the third transistor, and not in the gate region of the second transistor, the second gate electrode material comprising a second metal and having a second work function; and
forming a third gate electrode material in the gate region of the second transistor, and not in the gate region of the first transistor, and not in the gate region of the third transistor, the third gate electrode material comprising a third metal and having a third work function, wherein the second metal and the third metal are different; and
forming a fourth gate electrode material in the gate region of the third transistor and not in the gate region of the first transistor, and not in the gate region of the second transistor, the fourth gate electrode material comprising a fourth metal and having a fourth work function, wherein the first metal and the fourth metal are different.

17. A method as in claim 15, further comprising:
planarizing the gate electrode material.

18. A method as in claim 13, wherein the step of implanting the substrate comprises:
implanting the substrate under the gate region of the first transistor and under the gate region of the second transistor with a first dopant having the first conductivity type and a first implant dose; and
implanting the substrate under the gate region of the first transistor and under the gate region of the second transistor with a second dopant having the first conductivity type and a second implant dose.

19. A method as in claim 13, further comprising:
forming a NAND ROM comprising the first transistor.

* * * * *